US 12,334,347 B2

(12) United States Patent
Darras et al.

(10) Patent No.: US 12,334,347 B2
(45) Date of Patent: Jun. 17, 2025

(54) DETACHABLE STRUCTURE USED FOR TRANSFERRING OR HANDLING LAYERS, AND PROCESS FOR TRANSFERRING A LAYER USING THE DETACHABLE STRUCTURE

(71) Applicants: Commissariat À L'énergie Atomique Et Aux Énergies Alternatives, Paris (FR); Soitec, Bernin (FR)

(72) Inventors: François-Xavier Darras, Apprieu (FR); Vincent Larrey, Grenoble (FR)

(73) Assignees: Commissariat A L'énergie Atomique Et Aux Énergies Alternatives, Paris (FR); Soitec, Bernin (FR)

( * ) Notice: Subject to any disclaimer, the term of this patent is extended or adjusted under 35 U.S.C. 154(b) by 223 days.

(21) Appl. No.: 17/995,547

(22) PCT Filed: Mar. 16, 2021

(86) PCT No.: PCT/FR2021/050435
§ 371 (c)(1),
(2) Date: Oct. 5, 2022

(87) PCT Pub. No.: WO2021/198576
PCT Pub. Date: Oct. 7, 2021

(65) Prior Publication Data
US 2023/0154755 A1 May 18, 2023

(30) Foreign Application Priority Data
Apr. 1, 2020 (FR) ...................................... 2003263

(51) Int. Cl.
*H01L 21/18* (2006.01)
*H01L 21/02* (2006.01)
(Continued)

(52) U.S. Cl.
CPC ...... *H01L 21/187* (2013.01); *H01L 21/02002* (2013.01); *H01L 21/304* (2013.01); *H01L 21/7806* (2013.01)

(58) Field of Classification Search
CPC ............. H01L 21/187; H01L 21/02002; H01L 21/304; H01L 21/7806
(Continued)

(56) References Cited

U.S. PATENT DOCUMENTS 7,534,775 B2    5/2009 Zhang et al.
11,222,824 B2 * 1/2022 Bruel .................... H01L 21/185
(Continued)

FOREIGN PATENT DOCUMENTS

FR    2823599        10/2002
FR    2823596 A1     8/2004
(Continued)

OTHER PUBLICATIONS

International Search Report for International Application No. PCT/FR2021/050435 dated Jun. 23, 2021, 2 pages.
(Continued)

*Primary Examiner* — James D Sells
(74) *Attorney, Agent, or Firm* — TraskBritt

(57) ABSTRACT

A detachable structure comprises at least two interfaces including an assembly interface and a favored-detachment interface, a receiver substrate, and a donor substrate comprising a working layer that is to be transferred, arranged on an initial substrate. The favored-detachment interface is situated between the working layer and the initial substrate, and the assembly interface is situated between the working layer and the receiver substrate. The assembly interface has an assembly-interruption zone comprising at least one cavity present in the receiver substrate or in the working layer, and
(Continued)

the assembly-interruption zone is located in a peripheral region of the detachable structure.

20 Claims, 6 Drawing Sheets

(51) Int. Cl.
  *H01L 21/304* (2006.01)
  *H01L 21/78* (2006.01)
(58) Field of Classification Search
  USPC .......................................................... 156/701
  See application file for complete search history.

(56) References Cited

U.S. PATENT DOCUMENTS

2005/0101095 A1    5/2005   Fournel et al.
2009/0203167 A1    8/2009   Mitani
2014/0287567 A1    9/2014   Takano
2023/0230868 A1*   7/2023   Biard .................... H01L 21/324
                                                      257/678

FOREIGN PATENT DOCUMENTS

FR          2995446           3/2014
FR          3082997  B1      10/2020

OTHER PUBLICATIONS

International Written Opinion for International Application No. PCT/FR2021/050435 dated Jun. 23, 2021, 8 pages.
Office Action received for Korean Patent Application No. 10-2022-7034661, mailed on Apr. 14, 2025, 17 pages.

* cited by examiner

DETACHABLE STRUCTURE USED FOR TRANSFERRING OR HANDLING LAYERS, AND PROCESS FOR TRANSFERRING A LAYER USING THE DETACHABLE STRUCTURE

CROSS-REFERENCE TO RELATED APPLICATIONS

This application is a national phase entry under 35 U.S.C. § 371 of International Patent Application PCT/FR2021/050435, filed Mar. 16, 2021, designating the United States of America and published as International Patent Publication WO 2021/198576 A1 on Oct. 7, 2021, which claims the benefit under Article 8 of the Patent Cooperation Treaty to French Patent Application Serial No. FR2003263, filed Apr. 1, 2020.

TECHNICAL FIELD

The present disclosure relates to the field of transferring thin layers for applications in microelectronics, optics, microsystems, etc. It relates, in particular, to a detachable structure that may be used to transfer or to handle thin layers.

BACKGROUND

Numerous applications, in particular, in the fields of microelectronics, optics or microsystems, require thin layers (potentially incorporating components) that are arranged on specific substrates (thin, flexible, metal, insulating, etc., substrates). These specific substrates are not always compatible with the processes for fabricating thin layers and/or the processes for adding components to the layers.

It is therefore advantageous to be able to transfer a thin layer (with or without incorporated components) from an initial substrate that is compatible with the processes mentioned above to a specific target substrate possessing the required properties for the target application.

There are several processes for transferring a thin layer, produced on an initial substrate, to a target substrate.

Some transfer processes involve attaching the thin layer (arranged on the initial substrate) to the target substrate, then in mechanically and/or chemically removing the initial substrate, thus transferring the thin layer to the target substrate. The main drawbacks of this approach are the costs related to the loss of the initial substrate and the limiting mechanical and chemical treatments that are liable to negatively affect the quality of the thin layer during transfer.

Other processes are based on separating the thin layer from the initial substrate by subjecting a layer or a weakened interface present between the two to mechanical stress or by applying a chemical treatment thereto; the thin layer, having previously been attached to the target substrate, is transferred thereto as the separation operation is performed. Such is notably the case with the processes described in French Patent Publications FR2748851, FR2823599 or FR2823596; detachable structures are usually described as having a layer or a weakened interface, in which separation can be performed in such a way as to free a thin surface layer and transfer it onto a target substrate.

One difficulty associated with these approaches is that detachment may sometimes occur at interfaces or layers other than the weakened one due to the potential difficulty in precisely localizing the mechanical stress and/or the chemical attack to the weakened interface or layer. The variabilities in the geometry of the edges of the substrates, the method used to apply the mechanical stress or the chemical etching solution used for detachment may cause the separation to begin at an interface other than the weakened one, even if this other interface has a mechanical integrity superior to that of the weakened interface.

In order to address this problem, it is conceivable to reinforce locally, notably at the edges of the substrates, the mechanical integrity of the interfaces other than the weakened one and/or to reduce still further the integrity of the weakened interface. Nevertheless, these measures are not always able to prevent separation from being initiated at an interface that is not the intended one.

French Patent Publication FR2995446 is concerned with detachable structures comprising at least two interfaces, including the weakened one at which separation is expected. It offers solutions for redirecting the separation front toward the weakened interface when this separation begins at the other interface.

BRIEF SUMMARY

The present disclosure provides an alternative solution that assists with localizing the detachment into the weakened interface of a detachable structure. One subject of the present disclosure is a detachable structure comprising at least two interfaces, of which one is the weakened interface or favored-detachment interface. The detachable structure is used for transferring or handling layers.

The present disclosure relates to a detachable structure for transferring or handling layers, comprising:
- at least two interfaces, an assembly interface and a favored-detachment interface,
- a receiver substrate, and
- a donor substrate comprising a working layer that is to be transferred, arranged on an initial substrate,
- the favored-detachment interface being situated between the working layer and the initial substrate, and the assembly interface being situated between the working layer and the receiver substrate.

The detachable structure is notable in that the assembly interface has an assembly-interruption zone comprising at least one cavity present in the receiver substrate or in the working layer, in the latter instance, the depth of the cavity being strictly less than the thickness of the working layer. The assembly-interruption zone is located in a peripheral region of the detachable structure and allows a stress field at the head of the wave front of a separation wave to be modified when this wave is initiated in the assembly interface for the purposes of transferring or handling the working layer.

The modification of the stress field by the—at least one—cavity of the assembly-interruption zone allows the separation wave to be deflected from the assembly interface toward the favored-detachment interface, thus allowing the working layer to be moved over onto the receiver substrate.

According to advantageous characteristics of the present disclosure, taken alone or in any feasible combination:
- the assembly-interruption zone extends over a length, along the perimeter of the detachable structure, less than or equal to 20 mm;
- the assembly-interruption zone is situated at less than 10 mm from the edges of the detachable structure;
- the (at least one) cavity has lateral dimensions between a few microns and a few millimeters, preferably between 20 microns and 1 mm;
- the (at least one) cavity has a depth between 0.5 micron and several tens of microns, typically 50 microns;

the (at least one) cavity has, in a plane parallel to the assembly interface, a perimeter that is square, rectangular, triangular, trapezoidal or rounded;

at least one rectilinear segment of the perimeter of the (at least one) cavity is parallel to a detachable edge of the detachable structure or to the tangent to a detachment edge of the detachable structure;

a rectilinear segment of the perimeter of the (at least one) cavity, which has the greatest lateral dimension, is parallel to a detachment edge of the detachable structure or to the tangent to a detachment edge of the detachable structure;

the assembly-interruption zone comprises a plurality of cavities spaced apart by a distance between 1 micron and 1 mm, typically between several microns and several hundred microns;

the percentage of contact zones, between the cavities of the assembly-interruption zone, is less than 80%, or even less than 50%;

the cavities are aligned along a straight line or along a curved line of which the convexity is directed toward the center of the detachable structure;

the assembly-interruption zone is situated at less than 8 mm from the edges of the detachable structure, or even at less than 3 mm;

the working layer has a thickness between a few hundreds of nanometers and several hundreds of microns, typically between 200 nm and 200 microns;

the favored-detachment interface has a first interfacial surface energy, the assembly interface has a second interfacial surface energy, and the difference in interfacial surface energy between the favored-detachment interface and the assembly interface is greater than or equal to 1000 $mJ/m^2$;

the favored-detachment interface is a bonding interface using molecular adhesion having a first bonding energy, and the assembly interface is a bonding interface using molecular adhesion having a second bonding energy, the first bonding energy being less than the second bonding energy; and the difference in bonding energy between the favored-detachment interface and the assembly interface is at least on the order of 1000 $mJ/m^2$.

The present disclosure also relates to a process for transferring a working layer from a donor substrate to a receiver substrate, comprising the following steps:

a) the provision of a detachable structure as described hereinabove, b) the application of a mechanical stress to a detachment edge of the detachable structure, the detachment edge being located as close as possible to the assembly-interruption zone and the mechanical stress being able to initiate a separation wave at the assembly interface or at the favored-detachment interface, c) if the initiation of the separation wave occurs at the assembly interface, the deflection of the separation wave into the favored-detachment interface when the separation wave passes the assembly-interruption zone, and d) the propagation of the separation wave at the favored-detachment interface to result in the complete separation of the detachable structure.

According to advantageous characteristics of the present disclosure, taken alone or in any feasible combination:

the mechanical stress is applied in such a way that the direction of propagation of the separation wave is perpendicular to at least one rectilinear segment of a perimeter of the (at least one) cavity of the assembly-interruption zone;

the mechanical stress is applied in such a way that the direction of propagation of the separation wave is perpendicular to a rectilinear segment of a perimeter of the (at least one) cavity that has the greatest lateral dimension; and the mechanical stress is applied by inserting a bevel-edged tool between the edges of the receiver substrate and the edges of the donor substrate;

step a) comprises:
the provision of the donor substrate comprising the working layer arranged on the initial substrate, the favored-detachment interface being situated between the working layer and the initial substrate,
the provision of a receiver substrate,
the creation of at least one cavity opening onto a face that is to be assembled, belonging to the receiver substrate, or onto a face that is to be assembled, belonging to the working layer, in a peripheral region of the receiver substrate or of the working layer, and
the assembling of the working layer and of the receiver substrate at their respective faces that are to be assembled.

BRIEF DESCRIPTION OF THE DRAWINGS

Other features and advantages of the present disclosure will emerge from the following detailed description, with reference to the accompanying figures, in which.

DETAILED DESCRIPTION

In the descriptive section, the same references as in the figures may be used for elements of the same nature.

The figures are diagrammatic representations that, for the sake of readability, are not to scale. In particular, the thicknesses of the layers along the z-axis are not to scale with respect to the lateral dimensions along the x- and y-axes.

Figure 1A:
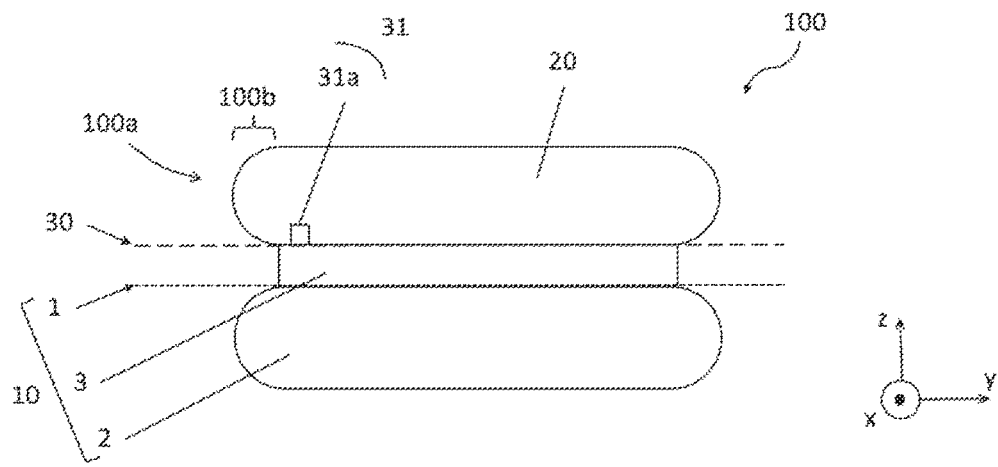
FIGS. 1A and 1B, respectively, depict a view in cross section, and a plan view, of a detachable structure according to the present disclosure; in the plan view, the cavities have been rendered visible for a better understanding of their distribution and location even though they ought to be hidden because they are positioned between the working layer and the receiver substrate.

The present disclosure relates to a detachable structure 100 comprising at least two interfaces, an assembly interface 30 and a favored-detachment interface 1. In FIG. 1A, the two interfaces extend in planes parallel to the plane (x, y).

What is meant by a detachable structure is a structure 100 intended to be stressed mechanically in order to initiate a desired separation at the favored-detachment interface 1; because of the presence of the second interface (assembly interface 30), the separation wave propagates concurrently in the two interfaces 1, 30.

The detachable structure 100 comprises a donor substrate 10 including a working layer 3 that is to be transferred, which layer is arranged on an initial substrate 2; the favored-detachment interface 1 is situated between the working layer 3 and the initial substrate 2.

By way of example, the working layer 3 may be formed from a semiconductor material such as silicon, silicon carbide, germanium, a III-V compound, etc., and/or from an insulating, notably piezoelectric, material such as lithium tantalate or lithium niobate. Of course, this list is not exhaustive and any material in the form of a thin layer that it might be desirable to transfer from the donor substrate 10 to a receiver substrate 20 could make up the working layer 3.

The working layer 3 may also comprise a plurality of films of different materials, and/or functional structurations (for example, cavities), particularly on its face that faces the receiver substrate 20, and/or may fully or partially comprise microelectronic components. The adhesion between the various films or stacks of components is expected, of course, to be stronger than the integrity of the favored-detachment interface 1 of which the characteristics will be detailed later. In general, the characteristics of the working layer 3 are dependent on the intended application and on the desired functionalities.

The working layer 3 has a thickness between a few hundreds of nanometers and a few hundreds of microns, for example, between 200 nm and 200 microns, or preferably between 1 micron and 50 microns.

The initial substrate 2 is advantageously formed of a low-cost material affording good mechanical support for the handling of the working layer 3. Although other materials can be envisaged, silicon is generally the material of choice because of its compatibility with any microelectronics manufacturing line.

The initial substrate 2 may be in the form of a wafer having a diameter from 100 mm to 450 mm and a thickness between 250 and 850 microns, for example. Of course, the initial substrate 2 may alternatively take other forms (for example, square).

The detachable structure 100 further comprises a receiver substrate 20, assembled on the donor substrate 10: the assembly interface 30 is situated between the receiver substrate 20 and the working layer 3.

The receiver substrate 20 may be made of an insulating, semiconductor or conducting material, and may be solid or comprise a plurality of layers or functional surface structurations (for example, cavities), or else again may fully or partially comprise active or passive components. The characteristics of the receiver substrate 20 are chiefly dependent on the intended application and the desired functionalities.

Like the initial substrate 2, the receiver substrate 20 may be in the form of a wafer having a diameter from 100 mm to 450 mm and a thickness between 250 and 850 microns, for example.

The detachable structure 100 according to the present disclosure is intended to be separated, at the favored-detachment interface 1, so that the working layer 3 can be transferred from the donor substrate 10 onto the receiver substrate 20.

In general, the mechanical integrity of the favored-detachment interface 1 is therefore inferior, or even very much inferior, to the mechanical integrity of the assembly interface 30, as is habitually the case in a detachable structure comprising two interfaces. Preferably, the aim will be to have a difference in mechanical integrity or in interfacial surface energy at least on the order of 1000 mJ/m² between the two interfaces 1, 30.

According to one advantageous embodiment, the favored-detachment interface 1 is a bonding interface using molecular adhesion having a first bonding energy E1. The assembly interface 30 may then be a direct-bonding interface, using molecular adhesion, thermocompression bonding, or some other technique, having a second bonding energy E2, the first bonding energy E1 being lower than the second bonding energy E2.

As is known per se, the difference between the first E1 and the second E2 bonding energies may be obtained by managing the surface roughnesses of the faces that are to be bonded, the materials brought into contact in order to achieve the molecular adhesion bonding, the chemical treatment (wet clean or plasma activation) applied to the faces prior to the bonding, etc. Materials such as silicon oxide, silicon nitride may be deposited on the faces that are to be bonded (in order to form the favored-detachment interface 1 or the assembly interface 30), and may be treated (cleaned, polished, activated by plasma, etched, etc.) in such a way as to adjust the resultant interfacial surface energy of the molecular adhesion bonding of the faces.

Advantageously, as stated previously, the difference in bonding energy (E2-E1) between the two interfaces 1, 30 is chosen to be at least on the order of 1000 mJ/m². By way of example, the first bonding energy E1 may be on the order of 2000 mJ/m², and the second bonding energy E2 may be greater than 3000 mJ/m². It will be recalled that, as is well known per se, a bonding energy may notably be evaluated by the Mazara blade measurement technique.

The detachable structure 100 according to the present disclosure is notable in that the assembly interface 30 has an assembly-interruption zone 31 comprising at least one cavity 31a present in the receiver substrate 20 or in the working layer 3. The assembly-interruption zone 31 corresponds to a zone in which the assembly interface is interrupted, namely where there is no contact between the receiver substrate 20 and the working layer 3.

The assembly-interruption zone 31 is located in a peripheral region of the detachable structure 100. As a preference, the assembly-interruption zone 31 is situated at less than 10 mm from the edges 100a of the structure 100. Advantageously, the assembly-interruption zone 31 is even situated at less than 8 mm from the edges 100a of the detachable structure, or even at less than 5 mm or else even at less than 3 mm.

It is commonplace for the detachable structures 100 formed from assembling two wafers 10, 20 of microelectronics grade to have a non-bonded peripheral exclusion zone 100b, connected with the edge geometry of the wafers (chamfer) or with the edge geometry of the working layer 3 present on one of the two wafers; this exclusion zone 100b rarely exceeds 1 mm to 2 mm. In the presence of this exclusion zone 100b, the assembly-interruption zone 31 is offset radially toward the inside of the detachable structure 100 with respect to the exclusion zone 100b, because it needs, by definition, to interrupt the assembly interface 30, which places the receiver substrate 20 and the working layer 3 in contact. It may be positioned, for example, at 0.5 mm, 1 mm or 2 mm from the exclusion zone 100b.

Advantageously, the assembly-interruption zone 31 is highly localized, which is to say that it does not extend, in the peripheral region, along the entire perimeter of the detachable structure 100 but only over a length of a few hundreds of microns (typically 200 microns) to a few tens of millimeters (typically 50 mm to 100 mm), for example, between 1 mm and 20 mm, preferably between 5 mm and 15 mm. This offers the advantage of limiting the impact it has on the usable surface area of the working layer 3.

Figure 2A:
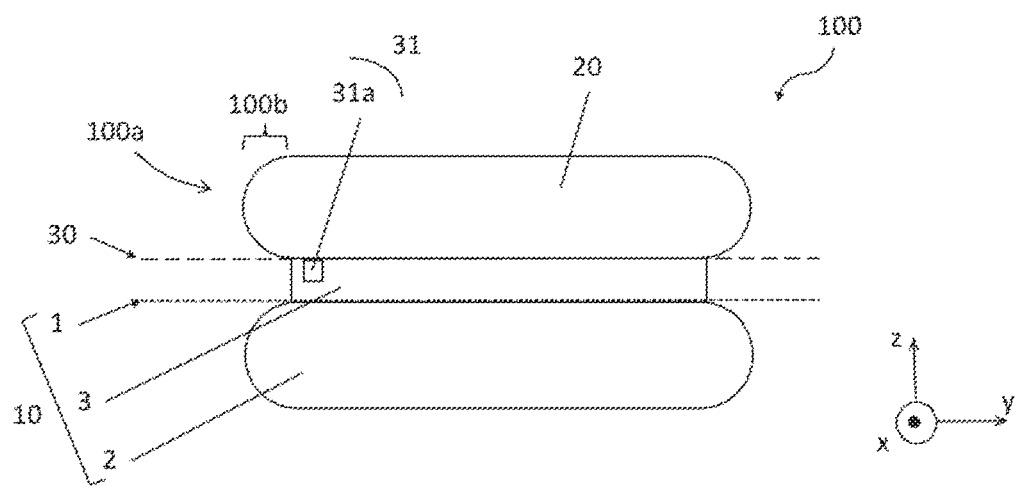
FIGS. 2A-2C, respectively, depict a view in cross section, and two plan views, of a detachable structure according to the present disclosure; in the plan views, the cavities have been rendered visible for a better understanding of their distribution and location even though they ought to be hidden because they are positioned between the working layer and the receiver substrate.

As mentioned previously, the assembly-interruption zone 31 comprises at least one cavity 31a formed either in the receiver substrate 20 (as illustrated in FIG. 1A) or in the working layer 3 (as illustrated in FIG. 2A). It should be noted that, in instances in which the (at least one) cavity 31a is formed in the working layer 3, its depth may vary, for example, between 5% and 95% of the thickness of the working layer 3, this depth, of course, never exceeding the thickness of the layer 3.

Advantageously, the assembly-interruption zone 31 comprises a plurality of cavities 31a.

Figure 1B:
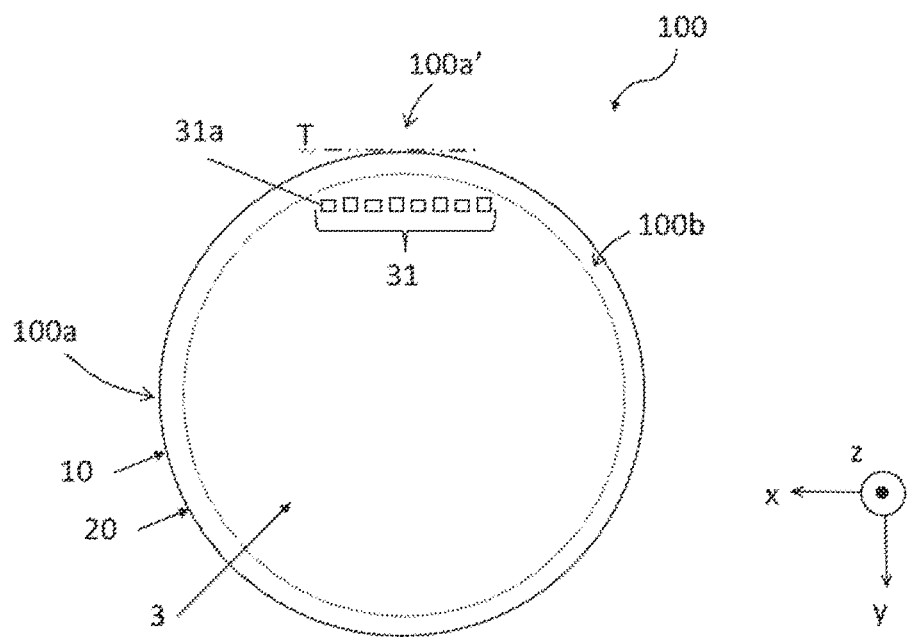
Figure 2B:
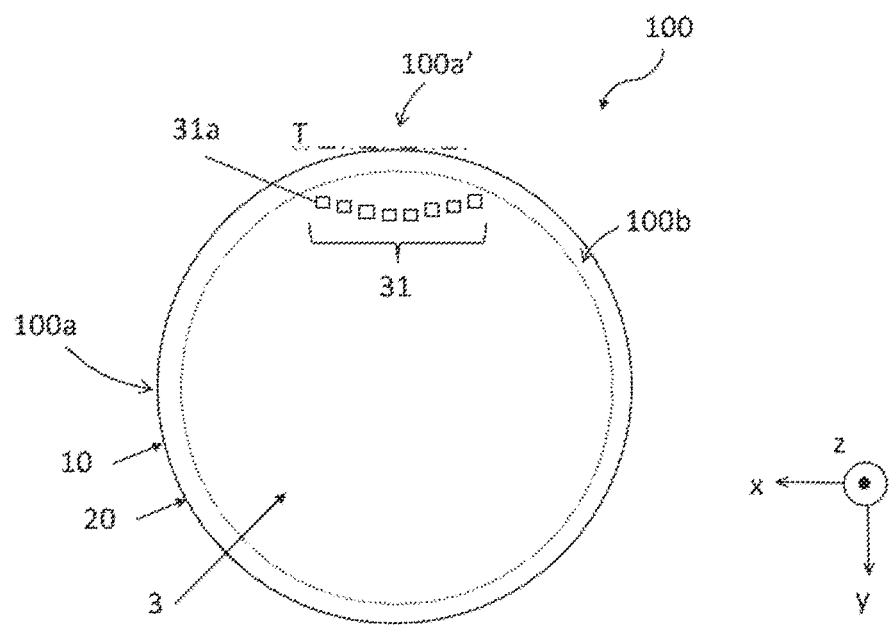
Figure 2C:
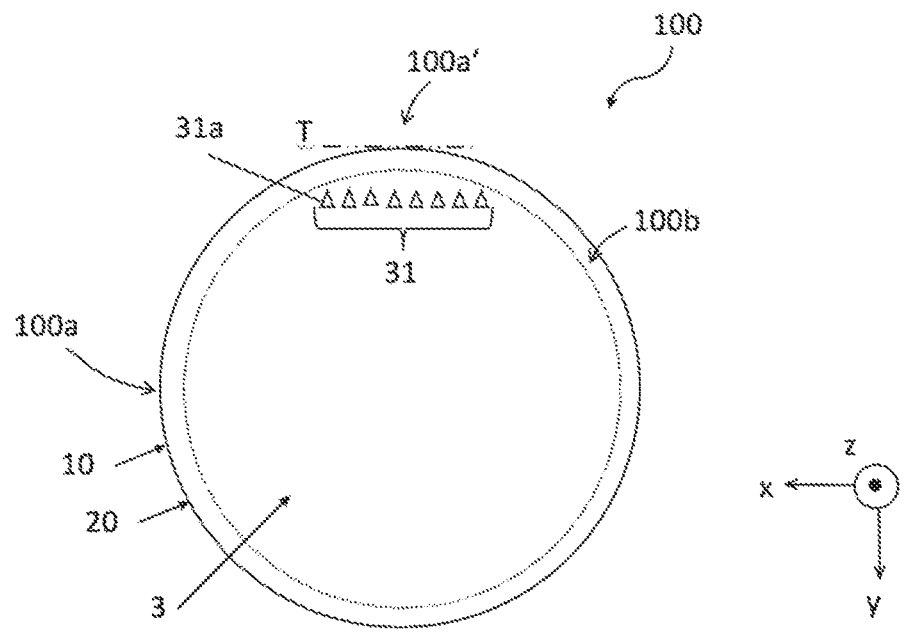

The cavities 31a may be spaced apart, for example, by a distance between 1 micron and 1 mm, typically between several microns and several hundreds of microns, for example, 500 microns. They may be aligned on a straight line or on a line that is curved in the plane (x, y) parallel to the assembly interface 30. The straight line is preferably parallel to the edge 100a of the detachable structure 100 or parallel to the tangent T to the edge 100a (FIGS. 1B and 2C). The curved line may have a convex curvature oriented toward the center of the detachable structure 100; in other words, as can be seen in the example of FIG. 2B, the curved line follows a curvature that is the opposite of that of the edges 100a of the detachable structure 100.

Mention will be made hereinafter of a cavity 31a, it being appreciated that the features listed may apply to all the cavities 31a that make up the assembly-interruption zone 31, if the latter comprises a plurality of same.

Advantageously, the cavity 31a has lateral dimensions between a few microns and a few millimeters, typically between 20 microns and 1 mm. It may moreover have a depth between 0.5 micron and several tens of microns, typically up to 20 microns, 50 microns, or even as much as 100 microns; for example, the cavity 31a may have a depth of 3 microns.

When the assembly-interruption zone 31 comprises a plurality of cavities 31a, the percentage of the zones of contact between the receiver substrate 20 and the working layer 3 (namely the percentage of the contact zones, between the cavities 31a of the assembly-interruption zone 31) is preferably less than 80%, or even less than 50%.

The (at least one) cavity 31a of the assembly-interruption zone 31 may have, in a plane (x, y) parallel to the assembly interface 30, a perimeter that is square, rectangular, triangular, trapezoidal or rounded.

As a preference, at least one rectilinear segment of the perimeter of the cavity 31a is parallel to a detachment edge 100a' of the detachable structure 100 or to the tangent T to a detachment edge 100a' of the detachable structure 100.

According to another preferred aspect, a rectilinear segment of the perimeter of the cavity 31a, which has the greatest lateral dimension, is parallel to a detachment edge 100a' of the detachable structure 100 or to the tangent T to a detachment edge 100a' of the detachable structure 100. For example, in the case of cavities that are rectangular, the long side of the cavities 31a in the plane (x, y) would run parallel to the tangent T.

In addition, when the shape of the cavity 31a is not symmetrical, there is a preferred direction in which to orient the pattern of the cavity 31a with respect to the detachment edge 100a' (or the tangent T thereto) or, more specifically, with respect to the direction of propagation of the separation wave, as will be described with reference to the transfer process according to the present disclosure. It would appear to be more advantageous for the separation wave to pass through a segment of greatest dimension last. In the example of FIG. 2C, if the cavities 31a in the assembly-interruption zone 31 have a triangular perimeter, it is therefore advantageous for these to be positioned in such a way that the vertex of the triangle points toward the detachment edge 100a'.

The present disclosure also relates to a process for transferring a working layer 3 from a donor substrate 10 to a receiver substrate 20.

The process comprises first of all a step a) of providing a detachable structure 100 as described hereinabove.

According to one embodiment, step a) comprises the following sub-steps referenced a1) to a4).

Figure 3A:
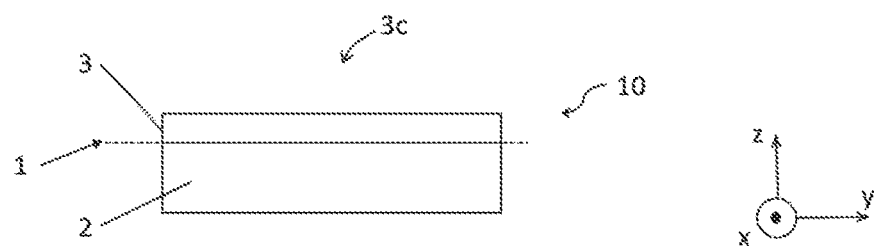
FIGS. 3A-3G show steps of the transfer process according to the present disclosure.

First of all, a step a1) comprises the provision of the donor substrate 10, which comprises the working layer 3 arranged on the initial substrate 2, the favored-detachment interface 1 being situated between the working layer 3 and the initial substrate 2 (FIG. 3A).

The working layer 3 of the donor substrate 10 may be produced using any known layer transfer technique, for example:
- by bonding followed by a mechanical/chemical thinning based on grinding, polishing, chemical etching and cleaning techniques; in which case the working layer 3 is derived from a working substrate bonded onto the initial substrate and then thinned down.
- using the Smart Cut® process to transfer a thin layer, typically of a thickness less than 2 microns; in which case the working layer 3 is likewise derived from a working substrate implanted with lighter species, bonded to the initial substrate and then separated along the buried fragile plane defined by the implantation.
- using the Smart Cut® process followed by a step of epitaxial growth or deposition aimed at thickening the working layer transferred.

The bondings mentioned in these various techniques result in the creation of the favored-detachment interface 1. It is therefore necessary to tailor the bonding parameters (the materials in contact, the roughnesses of the surfaces that are to be bonded, the cleaning operations and chemical activation treatments of the surfaces that are to be bonded, etc.) so as to obtain a first bonding energy (or first interfacial surface energy) E1 within the desired range, after the donor substrate 10 has potentially undergone heat treatments. Such is notably the case when films are deposited, and/or when functional structurations are made, and/or when all or some of the components are created on or in the working layer 3 before it is transferred onto the receiver substrate 20.

As a preference, the first bonding energy (or first interfacial surface energy) E1 is between 1000 mJ/m$^2$ and 3000 mJ/m$^2$. As mentioned previously, the aim will advantageously be to achieve an energy difference of 1000 mJ/m$^2$ at least between the favored-detachment interface 1 (energy E1) and the assembly interface 30, which will be formed in a later step a4) of the process.

Figure 3B:
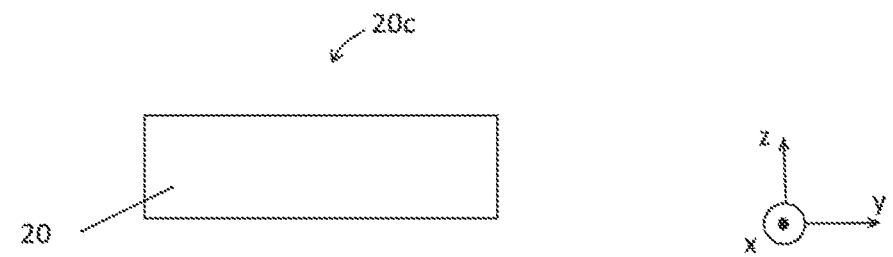

Step a2) of the process comprises providing the receiver substrate 20 the characteristics of which are dependent on the intended application and on the desired functionalities, as mentioned previously (FIG. 3B).

Figure 3C:
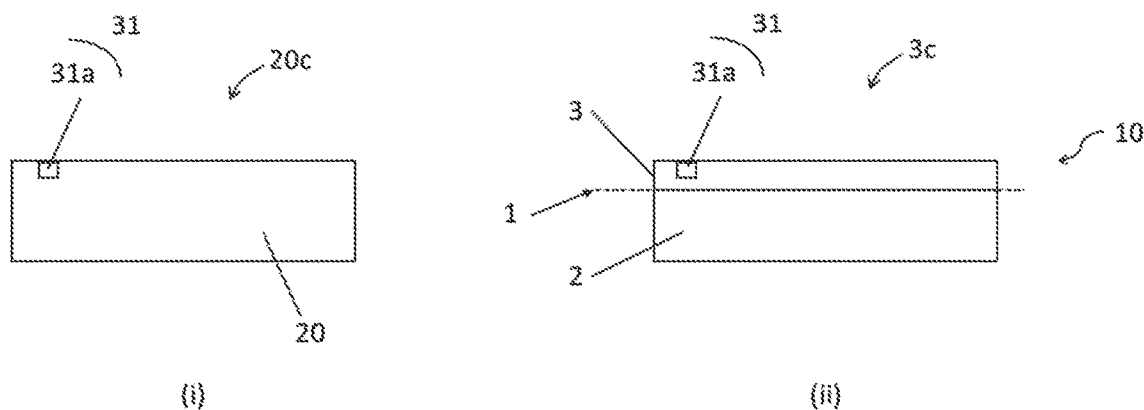

The next step a3) involves forming one or more cavities 31a opening onto a face 20c that is to be assembled, belonging to the receiver substrate 20 (FIG. 3C(i)) or onto a face 3c that is to be assembled belonging to the working layer 3 (FIG. 3C(ii)), in a peripheral region of the receiver substrate 20 or of the working layer 3, respectively. This (at least one) cavity 31a will enable the creation of the assembly-interruption zone 31 when the donor substrate 10 is assembled onto the receiver substrate 20.

The assembly-interruption zone 31 is localized to a peripheral region of the donor substrate 10 or of the receiver substrate 20 at less than 10 mm from the edges. Advantageously, the assembly-interruption zone 31 is even situated at less than 8 mm from the edges of the substrates, at less than 5 mm, or even at less than 3 mm.

The assembly-interruption zone 31 is preferably highly localized, which is to say that it does not extend, in the peripheral region, along the entire perimeter of the donor substrate 10 or of the receiver substrate 20, but only over a length of a few hundreds of microns to a few tens of millimeters.

The cavity 31a may be performed using conventional lithography and etching techniques. As mentioned previously, each cavity 31a preferably has lateral dimensions between a few microns and a few millimeters, a depth between 0.5 micron and a few tens of microns, and varying shapes in the plane (x, y).

Figure 3D:
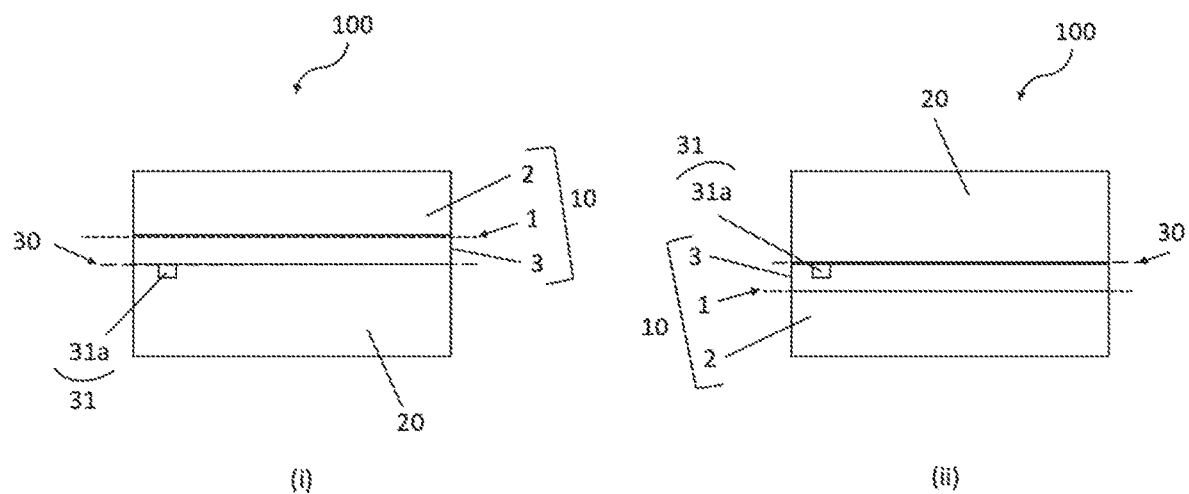

Finally, a step a4) comprises assembling the working layer 3 and the receiver substrate 20 at their respective faces 3c, 20c that are to be assembled, so as to form the detachable structure 100 (FIG. 3D(i) and (ii)).

As is well known per se, the assembling of the two substrates may be performed by direct bonding using molecular adhesion, by metallic bonding or by adhesive bonding, depending on the intended application and the compatibility of the bonding techniques.

The step a4) may involve, before bringing the substrates 10, 20 into contact, sequences of cleaning, depositing of adhesion-promoting layers, surface activation or other surface preparations. The step a4) may involve, after the substrates 10, 20 have been brought into contact, heat treatments for consolidating the assembly interface 30, at a greater or lesser temperature according to the type of bonding and the nature of the materials assembled and that make up the substrates 10, 20.

The assembly interface 30 formed at the end of this step a4) has a bonding energy E2 greater than the bonding energy E1 of the favored-detachment interface 1. In particular, the difference between the bonding energy E2 and the bonding energy E1 is on the order of 1000 mJ/m², or even higher.

Figure 3E:
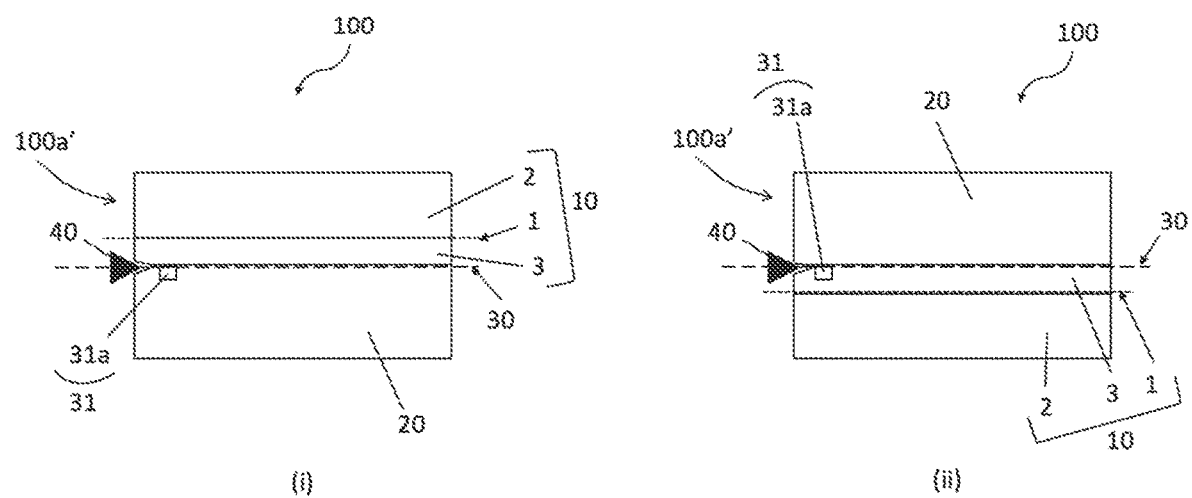

At the end of step a), one particular embodiment of which has just been described, the method according to the present disclosure comprises a step b) comprising applying mechanical stress to a detachment edge 100a' of the detachable structure 100 (FIG. 3E(i) and (ii)).

The detachment edge 100a' is located as close as possible to the assembly-interruption zone 31 and the mechanical stress is able to initiate a separation wave in the assembly interface 30 or in the favored-detachment interface 1. By way of example, the mechanical stress may be applied by inserting a bevel-edge 40 between the edges of the assembled donor substrate 10 and receiver substrate 20. Alternatively, it may be applied by injecting a liquid or gaseous fluid between these same edges, or by any other suitable technique.

Typically, the direction of the propagation wave is in the plane (x, y) and perpendicular to the detachment edge 100a' or to the tangent T to the detachment edge 100a'.

As mentioned previously, it is commonplace for a detachable structure 100 to have a peripheral exclusion zone, because of the edge geometry of the donor substrate 10 and receiver substrate 20. Note that, for the sake of simplicity, this exclusion zone is not depicted in FIGS. 3A to 3G.

When a mechanical stress is applied, for example, by inserting a bevel-edge 40, it is possible that the separation wave 41 may start at the assembly interface 30, this being despite the lower mechanical integrity of the favored-detachment interface 1. This starting of the separation wave 41 in the assembly interface 30 is notably encouraged by the presence of the exclusion zone, which provides direct access to the interface 30.

Figure 3F:
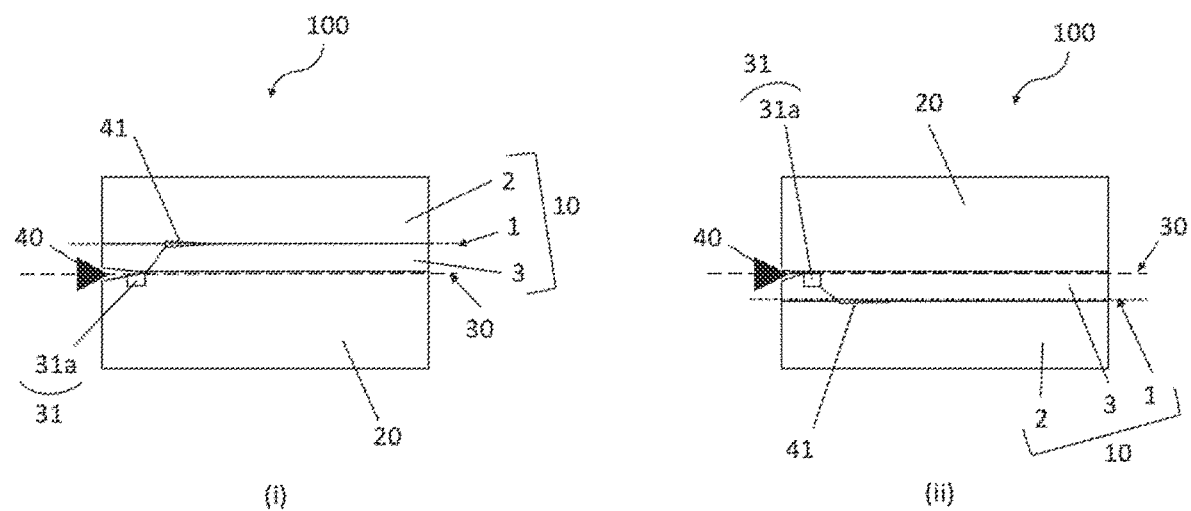

For that reason, the method according to the present disclosure continues with step c) during which, if the separation wave 41 has initiated at the assembly interface 30, the separation wave is deflected into the favored-detachment interface 1 as the separation wave 41 passes the assembly-interruption zone 31 (FIG. 3F(i) and (ii)). Effectively, the cavities 31a of the assembly-interruption zone 31 allow the stress field at the head of the wave front of the separation wave 41 to be modified, encouraging it to be deflected toward the lowest-energy interface, in this instance the favored-detachment interface 1.

Figure 4A:
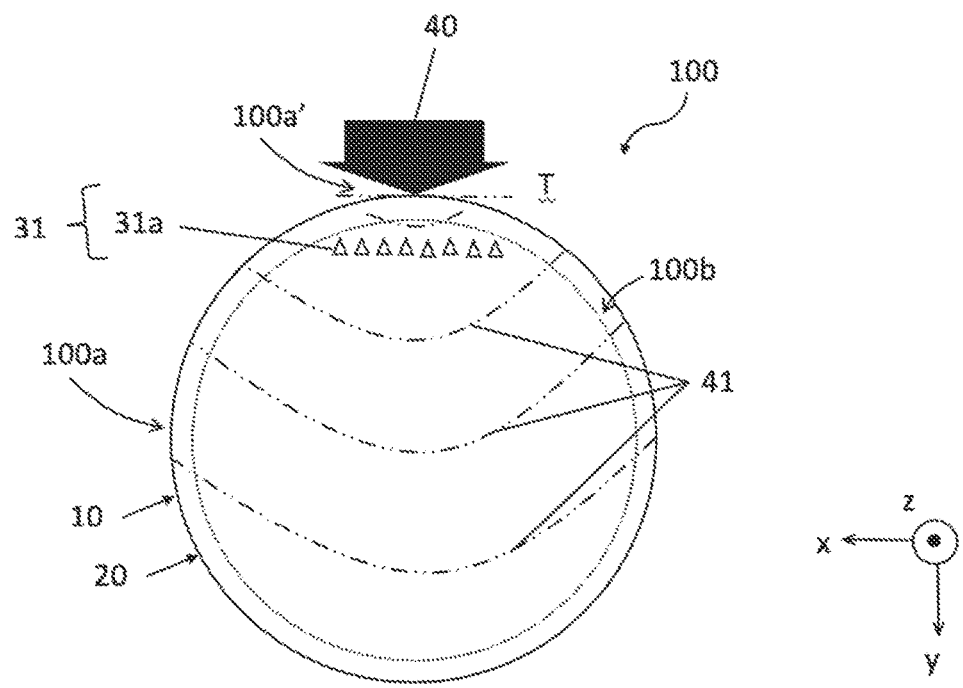
FIG. 4A depicts a plan view of a detachable structure during the course of the step of applying a mechanical stress, which is a step in the transfer process according to the present disclosure.

It is advantageous for the mechanical stress to be applied in such a way that the direction of propagation of the separation wave 41, parallel to the axis y in the figures, is perpendicular to at least one rectilinear segment of a perimeter of the cavity (or cavities) 31a of the assembly-interruption zone 31 (FIG. 4A).

According to another advantageous embodiment, the mechanical stress is applied in such a way that the direction of propagation of the separation wave 41 is perpendicular to a rectilinear segment of a perimeter of the cavity 31a that has the greatest lateral dimension. This scenario may be encountered, for example, when the cavity (or cavities) 31a has (or have) a rectangular shape. The longest dimension of the rectangle (the length) will preferably be oriented in such a way as to be perpendicular to the direction of propagation of the separation wave 41.

As mentioned previously, it is also advantageous, in the case of a cavity 31a of triangular shape, for the vertex of the triangle to point toward the detachment edge 100a; in other words, it is preferable for the separation wave initiated at the detachment edge 100a' to pass through the base of the triangle last (FIG. 4A).

It should be noted that, when the separation wave 41 is initiated directly in the favored-detachment interface 1 in step b), the passage of the wave at the assembly-interruption zone 31 does not modify its location: after crossing through the assembly-interruption zone 31, the separation wave 41 continues to propagate along the favored-detachment interface 1.

Figure 3G:
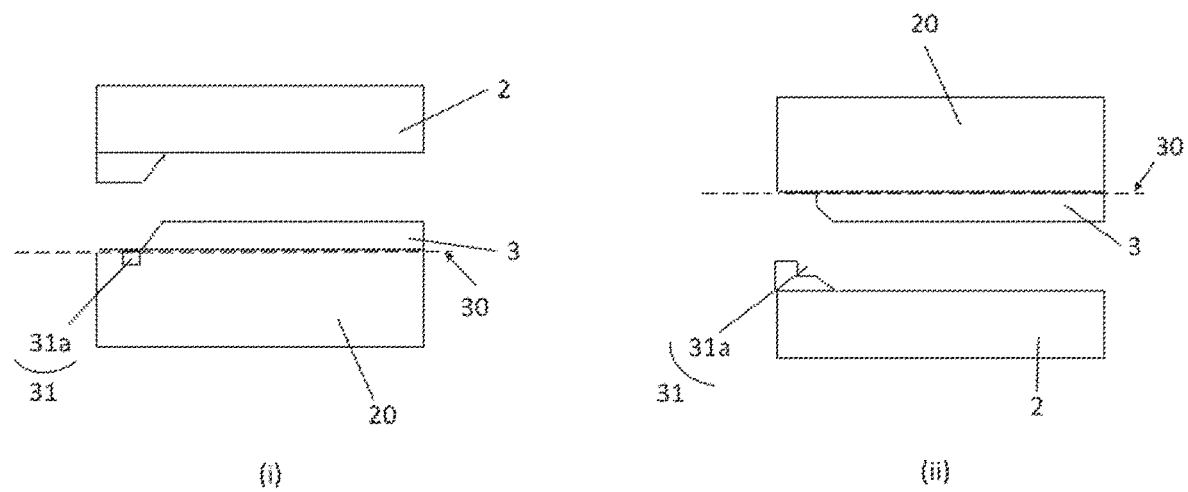

This transfer process next comprises a step d) of propagation of the separation wave at the favored-detachment interface 1, to result in the complete separation of the detachable structure 100 (FIGS. 3G(i) and 3G(ii)).

Once it has been deflected into the correct interface, the separation wave 41 easily propagates along the favored-detachment interface 1, of lower mechanical integrity, either spontaneously, if the mechanical stress applied to initiate the separation wave 41 was enough to cause the separation wave to propagate, or by the mechanical stress being maintained continuously or applied intermittently.

Figure 4B:
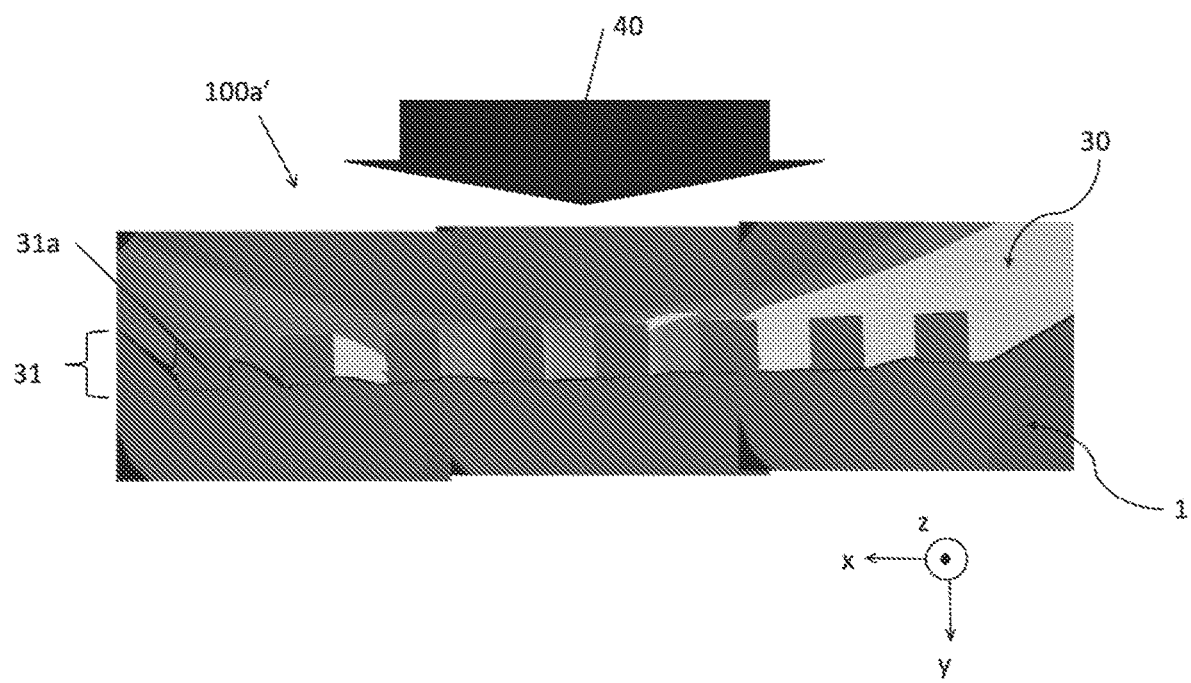
FIG. 4B depicts a photo, zooming in and around the assembly-interruption zone, of the moving of a working layer over onto a receiver substrate at the end of the transfer process according to the present disclosure.

FIG. 4B shows a photograph of a view from above of a working layer 3 (made of silicon) transferred onto a receiver substrate 20 (made of silicon) from a detachable structure 100 according to the present disclosure. The photograph, in particular, zooms in around the assembly-interruption zone 31, which is formed in the receiver substrate 20. It is possible to see the deflecting of the separation wave between the assembly interface 30 (direct bonding of the oxide SiO2/silicon type) upstream of the assembly-interruption zone 31, and the favored-detachment interface (direct bonding of SiO2/SiO2 type) downstream of the assembly-interruption zone 31. Downstream of the cavities 31a, the working layer 3 is transferred onto the receiver substrate 20. In the example of FIG. 4B, the eight cavities 31a that form the assembly-interruption zone 31 are square in shape, having lateral dimensions of 500 microns×500 microns, and a depth of 3 microns. They are situated approximately 3 mm from the edge.

The transfer process applied to the detachable structure 100 according to the present disclosure allows the separation wave 41 to be deflected effectively from the assembly interface 30 of the detachable structure 100 toward the favored-detachment interface. It is thus possible to maximize the surface area of the working layer 3 transferred onto a receiver substrate 20 and to transfer a working layer 3 of high quality.

Needless to say, the present disclosure is not limited to the embodiments described and implementation variants may be applied thereto without departing from the scope of the present disclosure as defined by the claims.

Although the preferred embodiments of the detachable structure 100 describe a favored-detachment interface 1 based on direct bonding using molecular adhesion, the present disclosure is equally applicable to other types of interface.

For example, the favored-detachment interface 1 could comprise a buried fragile plane obtained by the implantation of lighter species, the formation of a layer of porous material (for example, porous silicon) or else the formation of multilayer deposits of which one interface has a low energy (for example, as described in French Patent Publication FR3082997). With reference to this last option, mention may, for example, be made of a multilayer involving a layer of silicon oxide or silicon nitride on a layer of a noble metal (Au, Pt, Ag, etc.), the interface between these layers having a low interfacial surface energy.

In general, the present process is applicable as long as the detachable structure 100 comprises two interfaces 1, 30 exhibiting a sufficient difference in interfacial surface energy, in particular, an energy difference greater than or equal to 1000 mJ/m$^2$.

The invention claimed is:

1. A detachable structure for transferring or handling layers, comprising:
   at least two interfaces including an assembly interface and a favored-detachment interface;
   a receiver substrate;
   a donor substrate comprising a working layer to be transferred, the working layer disposed on an initial substrate;
   the favored-detachment interface being situated between the working layer and the initial substrate, and the assembly interface being situated between the working layer and the receiver substrate;
   wherein:
   the assembly interface has an assembly-interruption zone comprising at least one cavity present in the receiver substrate or in the working layer, if in the working layer, the depth of the cavity being strictly less than a thickness of the working layer,
   the assembly-interruption zone is located in a peripheral region of the detachable structure and does not extend along the entire perimeter of the detachable structure, the assembly-interruption zone allowing a stress field at a head of a wave front of a separation wave to be modified when this wave is initiated in the assembly interface to transfer or handle the working layer.

2. The detachable structure of claim 1, wherein the assembly-interruption zone is situated at less than 10 mm from the edges of the detachable structure.

3. The detachable structure of claim 1, wherein the assembly-interruption zone extends over a length, along the perimeter of the detachable structure, less than or equal to 20 mm.

4. The detachable structure of claim 1, wherein the at least one cavity has a depth between 0.5 micron and 50 microns.

5. The detachable structure of claim 1, wherein the at least one cavity has, in a plane parallel to the assembly interface, a perimeter that is square, rectangular, triangular, trapezoidal or rounded.

6. The detachable structure of claim 5, wherein at least one rectilinear segment of the perimeter of the at least one cavity is parallel to a detachment edge of the detachable structure or to a tangent to a detachment edge of the detachable structure.

7. The detachable structure of claim 5, wherein a rectilinear segment of the perimeter of the at least one cavity, which has a greatest lateral dimension, is parallel to a detachment edge of the detachable structure or to a tangent to a detachment edge of the detachable structure.

8. The detachable structure of claim 1, wherein the assembly-interruption zone comprises a plurality of cavities, the cavities being spaced apart by a distance between 1 micron and 1 mm.

9. The detachable structure of claim 8, wherein a percentage of contact zones, between the cavities of the assembly-interruption zone, is less than 80%.

10. The detachable structure of claim 8, wherein the cavities are aligned along a straight line or along a curved line of which a convexity is directed toward a center of the detachable structure.

11. The detachable structure of claim 1, wherein the assembly-interruption zone is positioned at less than 8 mm from the edges of the detachable structure.

12. The detachable structure of claim 1, wherein the working layer has a thickness between 200 nm and 200 microns.

13. The detachable structure of claim 1, wherein:
   the favored-detachment interface has a first interfacial surface energy;
   the assembly interface has a second interfacial surface energy;
   a difference in interfacial surface energy between the favored-detachment interface and the assembly interface is greater than or equal to 1000 mJ/m$^2$.

14. The detachable structure of claim 1, wherein the favored-detachment interface is a molecular adhesion bonding interface having a first bonding energy, and the assembly interface is a molecular adhesion bonding interface having a second bonding energy, the first bonding energy being less than the second bonding energy.

15. The detachable structure of claim 14, wherein the difference in bonding energy between the favored-detachment interface and the assembly interface is at least on the order of 1000 mJ/m$^2$.

16. A process for transferring a working layer from a donor substrate to a receiver substrate, comprising:
    providing a detachable structure according to claim 1;
    applying a mechanical stress to a detachment edge of the detachable structure, the detachment edge located as close as possible to the assembly-interruption zone, the mechanical stress being sufficient to initiate a separation wave at the assembly interface or at the favored-detachment interface;
    wherein, if the initiation of the separation wave occurs at the assembly interface, deflecting the separation wave into the favored-detachment interface when the separation wave passes the assembly-interruption zone; and
    propagating the separation wave at the favored-detachment interface to result in complete separation of the detachable structure.

17. The process of claim 16, further comprising applying the mechanical stress in such a way that the direction of propagation of the separation wave is perpendicular to at least one rectilinear segment of a perimeter of the at least one cavity of the assembly-interruption zone.

18. The process of claim 16, further comprising applying the mechanical stress in such a way that the direction of propagation of the separation wave is perpendicular to a rectilinear segment of a perimeter of the at least one cavity having the greatest lateral dimension.

19. The process of claim 16, further comprising applying the mechanical stress by inserting a bevel-edged tool between the edges of the receiver substrate and the edges of the donor substrate.

20. The process of claim 16, wherein providing the detachable structure comprises:
    providing the donor substrate comprising the working layer disposed on the initial substrate, the favored-detachment interface being disposed between the working layer and the initial substrate;
    providing a receiver substrate;
    forming at least one cavity opening onto a face to be assembled, belonging to the receiver substrate, or onto a face to be assembled, belonging to the working layer, in a peripheral region of the receiver substrate or of the working layer; and
    assembling the working layer and the receiver substrate together at their respective faces to be assembled.

* * * * *